United States Patent [19]

Skolnick et al.

[11] Patent Number: 4,779,044
[45] Date of Patent: Oct. 18, 1988

[54] VOLTAGE, CURRENT AND FREQUENCY MEASURING OF NON-STANDARD WAVEFORMS

[75] Inventors: Malcolm Skolnick; Ron Stubbers; Chris Hymel; Chen Chen, all of Houston, Tex.

[73] Assignee: Zion Educational Foundation, England

[21] Appl. No.: 95,009

[22] Filed: Sep. 8, 1987

[51] Int. Cl.⁴ ............................................. G01R 23/16
[52] U.S. Cl. ................................. 324/77 R; 324/78 D
[58] Field of Search ............... 324/77 R, 78 R, 78 D, 324/83 D, 79 R, 79 D; 377/20, 49, 51; 364/484; 328/129.1, 132

[56] References Cited

U.S. PATENT DOCUMENTS

| | | | |
|---|---|---|---|
| 3,938,042 | 2/1976 | Gliever | 324/78 D |
| 4,093,850 | 6/1978 | Karnowski et al. | 324/78 D |
| 4,310,795 | 1/1982 | Fremerey | 324/78 D |
| 4,468,614 | 8/1984 | Takahashi et al. | 324/78 D |
| 4,646,744 | 3/1987 | Capel | 128/423 R |
| 4,680,540 | 7/1987 | Niki et al. | 324/78 D |

Primary Examiner—Michael J. Tokar
Attorney, Agent, or Firm—Vanden, Eickenroht, Thompson & Boulware

[57] ABSTRACT

A regularly repetitive, almost periodic but non-regularly shaped waveform is amplitude sampled at an interval different from that of the waveform under investigation. For a voltage measurement, the positive samples are averaged for a predetermined count number (one set) and the negative samples are likewise averaged. Zero value samples are ignored. The highest absolute value of the two is taken as a meaningful measurement. Alternatively, one of these values can be selected. For a current measurement, a running average for a predetermined number of sets can also be developed. Finally, frequency can be developed by sensing the transitions and operating a counter on/off at the beginning and ending of a waveform cycle. The count of regular interval counts is then multiplied by the interval time to give the period of the waveform. The reciprocal of the period is a measure of the frequency.

15 Claims, 2 Drawing Sheets

IDEALIZED WAVEFORM

VOLTAGE, CURRENT AND FREQUENCY MEASURING OF NON-STANDARD WAVEFORMS

BACKGROUND OF THE INVENTION

1. Field of the Invention

This invention pertains to the metering or the utilizing of metered information pertaining to irregular, almost periodic electrical waveforms with currents and voltage outside normal ranges.

2. Description of the Prior Art

Regular electrical waveforms are routinely metered and the results of effectively measuring their parameters are routinely utilized in electrical devices and circuits of all manner of description. One of the most common of all waveforms is the sine wave. This waveform is regularly periodic and occurs naturally in numerous applications. Another regular waveform is the so-called "square wave" waveform. This waveform ascends to a stable positive value for a period of time and then changes substantially instantaneously to a like negative value for the same period of time. This pattern is repeated periodically. Both of these waveforms are "regular" in as much as the shape of the negative wave is the same as the positive wave albeit inverted. A regular pulse repeated with no interruptions is recognized as periodic. As used herein, the expression "periodic" waveforms refers to regularly repeated waveforms having no segments of zero amplitude. Thus, an interrupted sine wave would be deemed regular and almost periodic.

Electrical waveforms are associated with both the voltage condition and current condition of a given output. The periodicity of such voltage or current waveform is expressed in terms of its frequency. Voltage measurements are generally made in volts; current measurements are generally made in amperes and frequency measurements are generally made in cycles per second or pulses per second, often abbreviated "Hertz".

A "voltage" measurement, however, does not completely define which voltage measurement is being taken, there being at least three common voltage measurements made of regular waveforms, namely, "peak voltage", "average voltage" and root mean square or "rms" voltage. The same is true for current measurements. Instruments are available for making measurements of these aspects of many periodic electrical waveforms. In many cases, the actual display of measurements is not so much of interest as the effective determination of the measurement for use in performing a circuit function, for instance, determining an average voltage level that is then subsequently utilized as a feedback voltage.

If a waveform is not regular, that is, the shapes of the positive and negative wave components are different but are measured with apparatus designed for measuring regular waveforms, the measurement that is returned is adjusted by the apparatus to seem regular. That is, by looking at the measurement, a person would see a value that the irregular waveform would make on apparatus designed for measuring a regular waveform. In many applications this is undesirable since the results are incorrect and misleading.

One use where regular measuring apparatus is not sufficient or desirable for measuring or utilizing the parameters of an "irregular" waveform, is apparatus used in conjunction with transcranially stimulating a subject in accordance with the procedures described in U.S. Pat. No. 4,646,744, "Method and Treatment With Transcranially Applied Electrical Signals", Ifor D. Capel, issued Mar. 3, 1987 and U.S. patent application Ser. No. 874,451, "Method and Apparatus for Delivering a Prescriptive Electrical Signal", Malcolm H. Skolnick, filed June 16, 1986, which patent and application are incorporated herein by reference for all purposes. Such application illustrates an important feature of the invention, namely the ability to derive accurate measurements of the electrical waveform when it is applied across a complex impedance such as the human cranium combining elements of resistance, capacitance and inductance.

The general shape of one example of the voltage and current waveforms employed in the technique of the application above identified is generally, as follows. A pulse of the waveform advances almost instantaneously from a zero voltage level to a relatively high positive value and stays at that value for a relatively short period of time. Then the value drops to a relatively small negative value, where it stays for a relatively long period of time. Then the value becomes zero for a moderate amount of time. Then the next pulse begins with a relatively high positive value as with the first pulse. Ideally, the area under the positive envelope portion of the pulse equals the area under the negative envelope portion. (Hence, it will be seen that the "average" value of such a pulse is zero when determined by conventional means.) Alternatively to the example just described, a voltage or current waveform pulse alternates between a relatively large negative value of short duration and a relatively small positive value of long duration. In either event, the pulses occur at regular intervals.

It may be desirable in some cases to evaluate or measure only the positive portion of the waveform or only the negative portion, or to evaluate or measure only that portion of the waveform that might be dominant over the other. For example, if the negative portion of the waveform has a larger absolute amplitude than the absolute amplitude of the positive portion of the waveform for a period of time that then shifts to the alternate state after awhile, it may be desirable to detect the larger, i.e., the negative amplitude portion in the above example, and evaluate or measure it until such time that the positive portion has the dominant amplitude, and then evaluate or measure it. None of these desirable evaluations or measurements can be made using conventional techniques.

One technique that is used in the art for analyzing an ac waveform, i.e., one that alternates between a positive value and negative value or which varies in amplitude around a base value that may not be zero, is to first digitize the ac waveform. This is done by amplitude sampling the ac waveform at regular intervals, there being many samples per cycle of the ac waveform. Then the positive samples can be treated separately from the negative samples, or some other disposition can be made of the sampled values. Achieving accuracy in the technique of segmenting or sampling, of course, is only possible when the frequency of the ac waveform is relatively low so that a large number of samples can be made each cycle for digitizing purposes.

It is therefore a feature of the present invention to provide an improved method of determining the average value of one part of a repetitive irregular waveform that could be relatively high frequency without digitizing in accordance with prior art procedures.

It is another feature of the present invention to provide an improved method of determining the average value of one part of a repetitive irregular waveform by sampling at a rate different from the rate of the repetitive irregular waveform.

It is still another feature of the present invention to provide an improved method of measuring the frequency of a set of irregular pulses having a regularity in transition occurrences by sensing and counting a predetermined number of transitions of the irregular pulses, counting a number of regular-interval measurement pulses that occur during the time that said predetermined number of transitions of the irregular pulses occurs, determining the overall period of the counted regular pulses and hence the overall period of the counted transitions of the irregular pulses, and calculating the frequency of the irregular pulses by taking the reciprocal of the period for a complete cycle, i.e., the time duration between three transition occurrences.

SUMMARY OF THE INVENTION

The invention involves the method of determining the value of the average amplitude of one of a positive or negative portion of a regularly repetitive, almost periodic but non-regularly shaped, waveform by amplitude sampling at a rate that is preferably much greater than the interval rate of the waveform. However, in some circumstances, such as when a very narrow width pulse is used for amplitude sampling, the sample rate can be approximately the same as for the waveform. The samples are then classified as positive, negative or zero in value. Each the positive value samples and the negative value samples are averaged and the one with the largest absolute value is utilized by displaying or otherwise. Preferably, a large number of the pulses in a set of pulses are sampled. Sets of Two, Five and Ten Thousand samples have all been successfully employed. However, software used to implement the invention allows selection from a wide range of sampling frequencies.

For a series of sets of pulses of the form just described at low amplitude, a selection is made from the series of sets. Hence, for instance, five adjacent sets can be sampled prior to averaging and absolute value selecting. This is particularly useful for making current measurements where stability of the measurement over a long period of time is desirable.

For a waveform having predictable transition states, the method is disclosed of determining frequency by detecting a predetermined number of the transitions for the waveform, counting a number of regular-interval measurement or sampling pulses that occur during the time that the predetermined number of transitions of the waveform occurs, determining the overall period of the sampled pulses (which is equal to the overall period of the waveform), and determining the frequency of the waveform by calculating the reciprocal of the period. The frequency measurement is simplified by sampling only during one waveform cycle, i.e., between three transition occurrences.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the preferred embodiments thereof that are illustrated in the drawings, which drawings form a part of this specification. It is to be noted, however, that the appended drawings illustrate only preferred embodiments of the invention and are not to be considered limiting of its scope as the invention may admit to other equally effective embodiments.

In the drawings.

DESCRIPTION OF THE PREFERRED EMBODIMENTS

Figure 1:
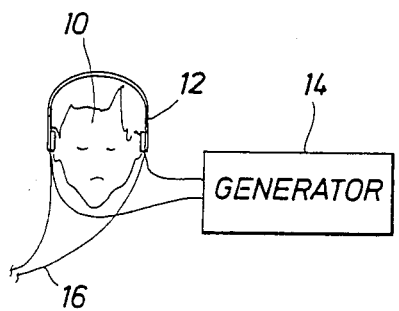
FIG. 1 is a schematic representation of an application of an irregularly shaped waveform, the measurements of which are usefully made in accordance with the present invention.

Now referring to the drawings and first to FIG. 1, a schematic representation of the application of an irregular waveform is illustrated. A human subject 10 is shown having a signal of the general shape to be described hereafter applied transcranially by appropriate transducers 12 attached to the earlobes of the subject in a manner fully described in U.S. Pat. No. 4,646,744 and U.S. patent application Ser. No. 874,451. The signal originates in generator 14 and is monitored for measurement and/or display purposes by connecting wires 16, also attached to transducers 12.

Figure 2:
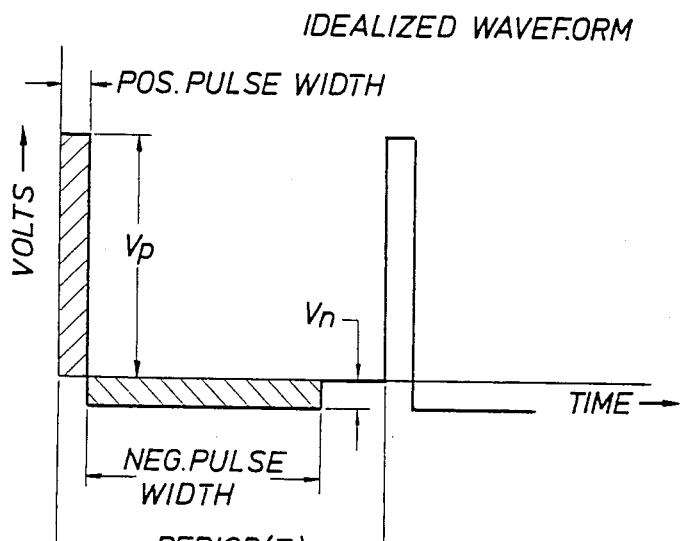
FIG. 2 is an idealized pulse waveform of a suitable waveform that is useful with the present invention.

Ideally, the applied voltage waveform takes the shape illustrated in FIG. 2. There are two portions of the pulse waveform, viz., (1) a relatively large amplitude positive portion having a relatively small width and (2) a subsequent relatively small amplitude negative portion having a relatively large width. The amplitude of the positive portion is identified as $V_p$ and the amplitude of the negative portion is identified as $V_n$. At the end of the negative portion, there is a zero voltage dwell time before the occurrence of the positive portion of the next pulse waveform. Hence, the period T for an entire pulse includes the widths of the positive and negative portions and the dwell time.

The current waveform is substantially the same as the voltage waveform and therefore is not separately illustrated.

Figure 3:
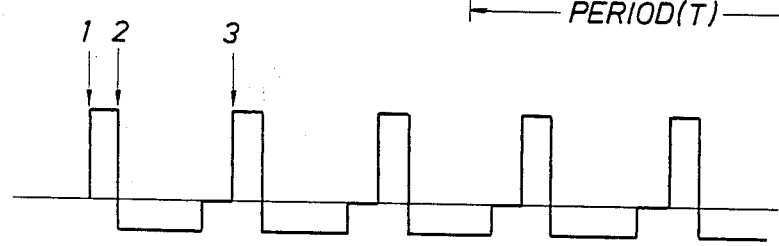
FIG. 3 is a waveform diagram of a series of pulse waveforms as shown in FIG. 2.

FIG. 3 illustrates a series of pulse waveforms as shown in FIG. 2. It may be seen that there are three transition occurrences for each pulse waveform, viz., transition 1 when the waveform goes positive in amplitude, transition 2 when the waveform goes negative and transition 3 when the waveform again goes positive. It will be noted that transition 3 of the second pulse is the same as transition 1 of the first pulse.

Although a particular waveform is shown, this invention is not limited thereto. For instance, the relative positive and negative amplitudes could be reversed. Also, more complicated waveform shapes could be analyzed and measured so long as they possess the general characteristic of having three detectable transition occurrences.

Generally, the areas under the respective positive and negative portions are equal, as noted by the shading in FIG. 2. Hence the average voltage of a pulse waveform is equal to zero voltage. However, it is important to be able to monitor and measure only the positive portion or only the negative portion or the larger of the positive and negative portions, which cannot be done by conventional measuring devices.

Although nominally the waveforms just described have equal positive and negative envelope areas, at any particular time the positive portion or the negative portion may become dominant, and therefore, it cannot be assumed that these areas are equal.

Figure 4:
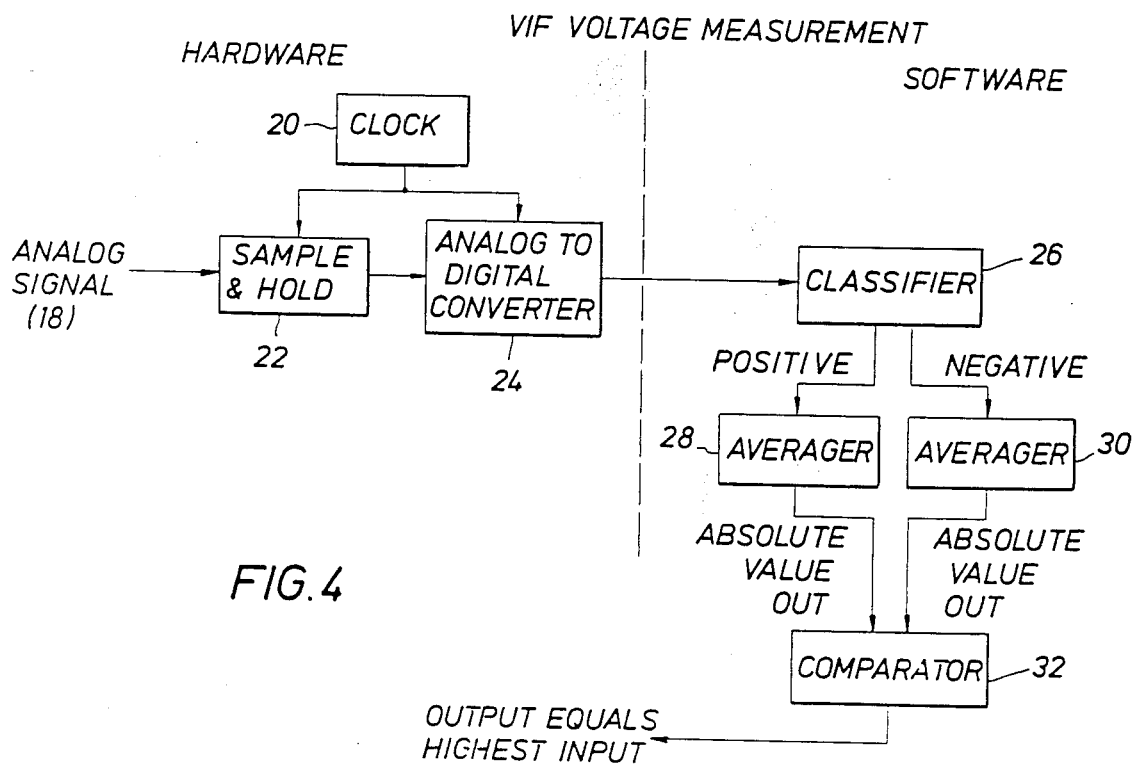
FIG. 4 is a block diagram of components useful in making voltage measurements in accordance with the present invention.

Now referring to FIG. 4, a block diagram is shown of hardware and software suitable for measuring voltage in accordance with the present invention. The hardware portion of the diagram is shown on the left side of the diagram and the software portion is shown on the right, although it is possible to implement the invention using all hardware components, if desired. Analog signal or pulse waveform 18 is an irregular waveform of the type generally described above comprising a plurality of pulses. Pulse widths of the positive amplitude produced at a minimum of 100 microseconds are typical. A clock 20 operating at a different rate from the pulse waveform is connected to sample-and-hold circuit 22 to sample the pulse waveform. For example, the sampling interval as controlled by clock 20 is typically between 160–320 microseconds. Timing of the measurement is independent of the pulse interval. The invention contemplates that the sampling interval can be shorter than the interval of the pulses in the waveform as well as longer, however. The output of sample-and-hold circuit 22 is applied to analog-to-digital converter (ADC) 24, where the sampled amplitude is converted to a digital value for application to classifier 26. Clock 20 also determines the timing operation of ADC 24.

Classifier 26 channels the individual positive digital values to averager 28 and the individual negative digital values to averager 30. The sampled zero values do not enter into the operation at all. A relative large number of samples are included in a sample set for operation of the device. Sets of 2000, 5000 and 10,000 have all been successfully employed.

The absolute average values ignoring whether the value is positive or negative, are applied from averager 28 and averager 30 to comparator 32, which selects the higher of the two applied values and produces a digital output value. Such value may be displayed, stored or used in a subsequent device (not shown). Hence, there is an effective monitoring or measuring of the pulse waveform for many applications not capable of being performed in any other manner. The information is derived from many, many cycles of the applied waveform and there is no digitizing of a single waveform in order to arrive at the output value.

Alternative to selecting the average value over an entire set of samples, the individual peak from the respective sets can be employed. However, such a scheme is not generally as useful since it would not discriminate against noise spikes.

Figure 5:
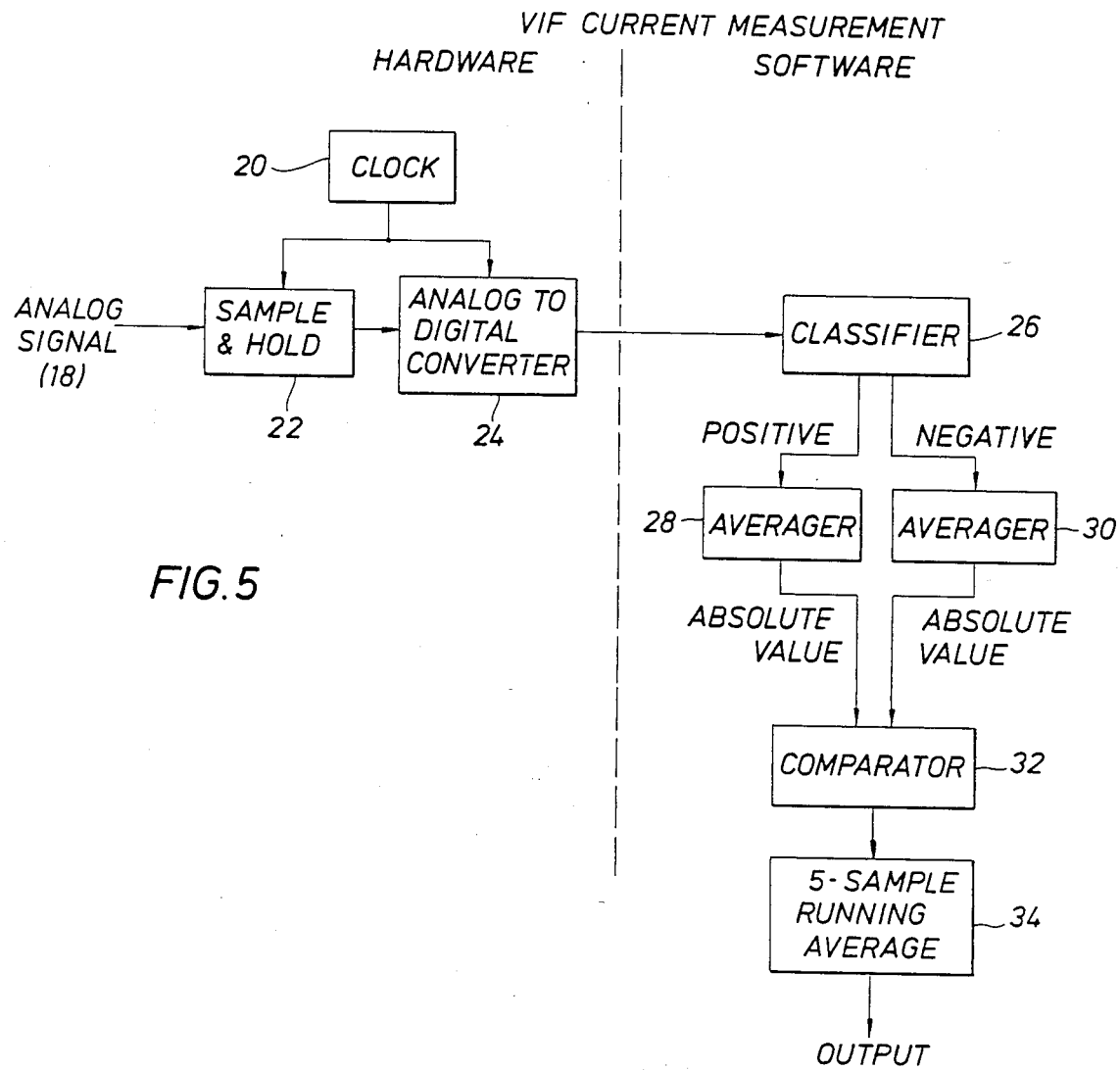
FIG. 5 is a block diagram of components useful in making current measurements in accordance with the present invention.

FIG. 5 is a block diagram of the components utilized in a preferred arrangement for developing a current measurement of the pulse waveform previously described. Basically, the same components are employed, both hardware and software, as are used for the voltage measurement, except for the final component. Because of the similarity in components in the two circuits, the reference numbers are repeated for like components. In this case, however, the output from comparator 32 is applied to 5-sample running average circuit 34. This circuit, in effect, takes five sets of the sampled values before producing an output. Thereafter, its indicated output changes each time there is another set of samples received by dropping the earliest value for the previously supplied sets and averaging in the value of the newest or latest set. Hence, what is produced is a running average of the latest five sets. Of course, a running average of a different number of sets can be developed, if desired. The purpose of such a circuit is to stabilize the current measurement from sampled inputs that are five times the number for the voltage measurement.

Figure 6:
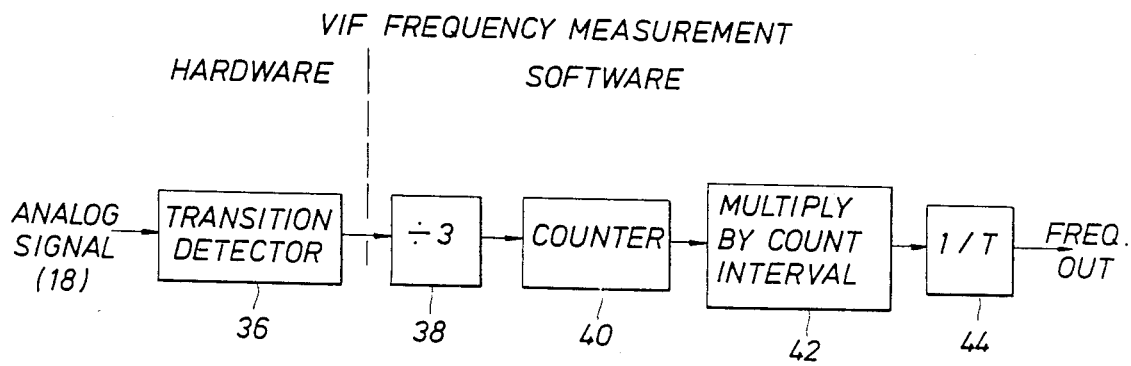
FIG. 6 is a block diagram of components useful in making frequency measurements in accordance with the present invention.

The basic components that enter into making a frequency measurement in accordance with the present invention are shown in FIG. 6. Again, the division between hardware and software components is illustrated. The analog signal or the pulse waveform 18 is applied to a transition detector 36 that produces an output corresponding to each transition, as shown in FIG. 3. That is, for each transition 1,2,3, and so forth there is an output from transition detector 36 to socalled "divide-by-three" circuit 38. With reference to FIG. 3, when transition 1 is detected there is an output from circuit 38 to counter 40 to begin the counter running. The counter includes an internal clock that produces a count at a predetermined fixed interval that is a small fraction of the expected period of the waveform between transition 1 and 3, the period of a single waveform cycle. The second transition is ignored by circuit 38 and the third transition stops counter 40. Hence, the count is a measurement of the period of one cycle of the waveform. The components shown in FIG. 6 are usually housed in the same device as those in FIGS. 4 and 5. The frequency of clock 20 is selectable between 160 and 320 microseconds. This selection is accomplished by a software timing loop keyed to time the microprocessor instruction cycle.

The output from counter 40 is applied to multiplier 42, which is preprogrammed to multiply by the known interval of the counter pulses. Thus, the output of multiplier 42 is the period of the cycles in the waveform. Reciprocal circuit 44 effectively divides "1" by the period to produce the frequency measurement.

Alternatively to the above, "divide-by-three" circuit 38 can be programmed to operate on by a beginning or onset transition and off by a terminal transition after a predetermined number of cycles, for example, after twenty cycles have passed. The count from counter 40 would now be equivalent to the period for twenty cycles, not just one. The output from multiplier 42 then would be the period for twenty cycles. Therefore, reciprocal circuit 42 would have to first divide by the number of cycles to develop the period for a single cycle before the reciprocal value was taken to determine the frequency. The advantages of such a scheme, however, is to develop a stabilized measurement with respect to a large number of cycles, not just one. Moreover, the use of a count interval for the counter can be larger than is used for measuring a single waveform, since the margin of error is reduced at the end of the waveform for a partial or uncompleted count when averaged over a large number of cycles of the waveform.

The simplified diagrams of FIGS. 4, 5 and 6 do not show amplifiers, switches, level shifters and the like. For example, if it is not desired to select the larger of the absolute values of the positive portion and negative portion, a switch can be provided to disconnect the components of that portion that is not of interest. Also, there may be a dc signal component superimposed on the waveform shown in FIG. 2. In that case, a level shifter can be included to take out the dc signal component. Also, if an extraneous measurement is to be made not connected with the voltage-current-frequency measuring device just described, for example, the measurement of the impedance of the subject connected to the waveform as stimulus, the device can be switched out altogether.

While several embodiments of the invention have been described and simplified embodiments illustrated, it will be understood that the invention is not limited thereto, since many modifications may be made and will become apparent to those skilled in the art.

What is claimed is:

1. The method of determining the average value of one of the positive and negative pulse portions of a pulse waveform comprising a plurality of individual pulses, each individual pulse having positive and negative pulse portions, each pulse portion being defined by its amplitude and its width, there being included in the pulse waveform timed pulse intervals, which comprises
   sampling the pulse waveform amplitude a number of times in excess of 1000 and at a time interval different from the time interval of the pulses in the pulse waveform;
   classifying the samples as positive, negative, and zero;
   averaging the positive samples;
   averaging the negative samples; and
   selecting as an absolute value the larger of the positive sample average and the negative sample average.

2. The method in accordance with claim 1, wherein the larger of the positive sample average and negative sample average is selected by observation of a visual display of the sample values.

3. The method in accordance with claim 1, wherein the pulse interval of the pulses in the pulse waveform is less than the sampling interval.

4. The method in accordance with claim 1, wherein the interval of the pulses in the pulse waveform is 100 microseconds and the sampling interval is in the range between 160 and 310 microseconds.

5. The method in accordance with claim 1, wherein the pulse interval of the pulses in the pulse waveform is greater than the sampling interval.

6. The method in accordance with claim 1, wherein sampling is taken in the range between 5000 and 10,000.

7. The method for determining the average value of one of the positive and negative pulse portions of a pulse waveform comprising a plurality of individual pulses, each individual pulse having positive and negative pulse portions, each pulse portion being defined by its amplitude and its width, there being included in the pulse waveform timed pulse intervals, which comprises
   sampling the pulse waveform amplitude for a first set of pulses by sampling a predetermined number of times in excess of 1000 at a time interval different from the time interval of the pulses in the pulse waveform;
   classifying the samples for said first set of pulses as positive, negative, and zero;
   subsequently sampling the pulse waveform amplitude for additional sets of pulses in respectively the same manner as sampling for said first set of pulses;
   subsequently classifying the samples for said additional sets of pulses in respectively the same manner as for said first set of pulses;
   averaging the positive samples from all of said sets of pulses;
   averaging the negative samples from all of said sets of pulses; and
   selecting as an absolute value the larger of the positive sample average and the negative sample average.

8. The method in accordance with claim 7, and including subsequently sampling the pulse waveform amplitude for an additional set of pulses by sampling an additional predetermined number of times in excess of 1000, discarding the first predetermined number of samples previously sampled, and adding said additional predetermined number of samples.

9. The method in accordance with claim 7, wherein the larger of the positive sample average and negative sample average is selected by visually displaying.

10. The method in accordance with claim 7, wherein the total number of sets of pulses sampled is five.

11. The method in accordance with claim 7, wherein the pulse interval of the pulses in the pulse waveform is less than the sampling interval.

12. The method in accordance with claim 7, wherein the interval of the pulses in the pulse waveform is 100 microseconds and the sampling interval is in the range between 160 and 310 microseconds.

13. The method in accordance with claim 7, wherein sampling is taken in the range between 5000 and 10,000.

14. The method of determining the frequency of repetition for the pulses in a pulse waveform, each individual pulse having positive and negative pulse portions, each pulse portion being defined by its amplitude and its width, there being included in the pulse waveform timed pulse intervals, which comprises
   detecting the onset transition of a pulse in the pulse waveform and the termination transition of said pulse;
   generating timed samping counts having a predetermined sampling time interval different from said pulse time interval;
   counting the number of sampling counts between said onset transition and said termination transition;
   multiplying the number of sampling counts by said known predetermined time interval to determine the period of the pulses in said pulse waveform; and
   determining the reciprocal of the period of the pulses in said pulse waveform as an indication of the frequency of the pulses in said pulse waveform.

15. The method in accordance with claim 14, wherein the detecting step is performed using a comparator.

* * * * *